United States Patent [19]

Konishi

[11] 3,895,391

[45] July 15, 1975

[54] MAGNETOSENSITIVE THIN FILM SEMICONDUCTOR ELEMENT AND A PROCESS FOR MANUFACTURING SAME

[75] Inventor: Katsuo Konishi, Tokyo, Japan

[73] Assignee: Hitachi, Ltd., Japan

[22] Filed: Nov. 6, 1973

[21] Appl. No.: 413,222

[30] Foreign Application Priority Data

Nov. 8, 1972 Japan .............................. 47-111142

[52] U.S. Cl. .......................... 357/27; 357/15; 357/4

[51] Int. Cl. .......................... H01l 11/00; H01l 15/00

[58] Field of Search ........... 317/235, 23, 31, 234, 8, 317/8.1

[56] References Cited

UNITED STATES PATENTS

| | | | |
|---|---|---|---|
| 3,192,471 | 6/1965 | Kurt et al. | 317/235 H |
| 3,260,980 | 7/1966 | Weiss | 317/235 H |
| 3,305,814 | 2/1967 | Moyer | 317/234 S |
| 3,339,129 | 8/1967 | Bulman et al. | 317/235 H |
| 3,410,721 | 11/1968 | Hini | 317/235 H |
| 3,617,975 | 11/1971 | Wieder | 317/235 H |
| 3,623,030 | 11/1971 | Sawyer | 317/235 A |
| 3,667,000 | 5/1972 | Bergmans | 317/235 H |

*Primary Examiner*—Andrew J. James
*Attorney, Agent, or Firm*—Craig & Antonelli

[57] ABSTRACT

A magnetosensitive thin film semiconductor element having the structure in which said element is comprised of a substrate of a material exhibiting a high magnetic permeability, the surface of which has channels of a desired pattern and depth, and comprised of a thin film embedded therein, said substrate, if necessary, being covered by an insulator film, and a process for manufacturing the semiconductor element, which comprises steps of depositing a semiconductor thin film by, for example, vacuum evaporation over the entire surface of the substrate and thereafter removing the amount of the thin film which was not deposited inside said channels, by polishing or grinding. In accordance with the process, the thin film semiconductor element having a uniform thickness of thin film can be easily obtained and is not affected by mechanical pressure applied in the subsequent step.

10 Claims, 10 Drawing Figures

PATENTED JUL 15 1975 SHEET 1 3,895,391

MAGNETOSENSITIVE THIN FILM SEMICONDUCTOR ELEMENT AND A PROCESS FOR MANUFACTURING SAME

BACKGROUND OF THE INVENTION

1. Field of the Invention

The present invention relates to a magnetosensitive thin film semiconductor element, particularly a magnetosensitive thin film semiconductor element having an embedded type structure, comprised of a substrate of a material exhibiting a high magnetic permeability and a semiconductor thin film applied thereon, and a process for manufacturing the same.

2. Prior Art

Prior magnetosensitive thin film semiconductor elements, such as a Hall element, have the structure in which a thin semiconductive layer of a predetermined pattern is allowed to adhere to the surface of a substrate having a high magnetic permeability, the substrate, if necessary, being covered by an insulator film. This thin semiconductive layer is projected on the substrate. Therefore, when a subsequent step is to allow a further article to adhere onto the thin semiconductive layer, pressure required for the adhesion has an adverse effect on the resulting semiconductor element such that the properties of the element are deteriorated. For example, a Hall-effect magnetic head has normally the structure in which pole pieces are fastened onto the element under pressure. The mechanical pressure under which the pole pieces are fixed is applied to the element, and then there are produced such unfavorable effects that the element is mechanically broken or noise is increased by the piezo effect.

Furthermore, the semiconductor element has been hitherto formed by grinding the surface of a semiconductor thin film deposited over a substrate by means of vacuum evaporation until a predetermined thickness was obtained, and then making a predetermined pattern by means of photoetching or the like. Such prior art has difficulties in obtaining the vacuumevaporated semiconductor thin film having a uniform thickness and, therefore, said element has a great dispersion in electric properties.

Still further, the prior art thin film semiconductor element has such a defect that at step-like portions on a substrate which are naturally formed when a further thin film is deposited onto the element by means of vacuum evaporation, e.g., when aluminum electrodes or wirings are provided in the form of a further thin film on the element, the further thin film tends to be torn.

SUMMARY OF THE INVENTION

An object of the present invention is to eliminate the defects or troubles in the prior art as mentioned above.

Another object of the present invention is to provide a magnetrosensitive thin film semiconductor element having the structure in which the thickness of a thin film is uniform and on which mechanical pressure applied in a subsequent step has no adverse effects on the element.

A further object of the present invention is to provide a process for manufacturing the magnetosensitive thin film semiconductor element with ease.

The above-mentioned objects are achieved by providing a magnetosensitive thin film semiconductor element comprising a substrate consisting of a material having a high magnetic permeability on the surface of which channels of a predetermined pattern are formed and the surface of which is covered, if necessary, with an insulator film, the channels having a semiconductor thin film embedded therein. The thin film semiconductor element according to the present invention is easily manufactured through steps of depositing a semiconductor thin film over the entire surface of said substrate by, for example, vacuum evaporation and removing the deposited amounts of the thin film from the area outside the channels by polishing or grinding. Between the steps other steps such as heat treatment may be inserted.

All semiconductive materials usually used in semiconductor devices, such as Si, Ge, etc., are useful for the magnetosensitive thin film semiconductor element of the present invention, but when the element is employed as a Hall element a compound having a high electron mobility and Hall coefficient, such as InSb or InAs, is desirable, and particularly InSb has a higher electron mobility and gives a good result. This semiconductor thin film is normally made of a polycrystal but may be of a single crystal.

The magnetic material used for the substrate of the present invention is required to have a high magnetic permeability. For such magnetic material ferrite is generally used, which is readily available. However, materials other than ferrites may be used.

The magnetosensitive thin film semiconductor element as manufactured above has no projected portions of the thin film on the substrate but the thin film is embedded in the channels of the substrate. Therefore, if an attachment such as a pole piece is applied onto the element under pressure, this pressure is applied to the substrate alone. Thus, no unnecessary and detrimental pressure is applied to the semiconductor thin film.

The uniformity of the thickness of the semiconductor thin film is referred to hereinafter. When the thickness to be deposited is smaller than the depth of the channels, the use of a method for obtaining a uniform thickness of a deposit, for example, vacuum evaporation may achieve naturally a uniform thickness. On the other hand, when the thickness to be deposited is greater than the depth of the channels, the amount of the thickness deposited outside the channels is totally removed from the surface of the substrate by polishing or grinding. Thus, the thickness of the semiconductor thin film is the same as the depth of the channels. Therefore, as long as the depth is uniform, the thickness is also uniform. In this case, the substrate is preferably made of a material which is adequately harder than a material used for the semiconductor thin film, because the polishing is naturally stopped level with the surface of the substrate.

Furthermore, when the thickness of the semiconductor thin film is intended to be equal or approximately equal to the depth of the channels of the substrate, the surface of the substrate and the surface of the semiconductor thin film are approximately in the same level with each other and there is no projection on the surface of the element. Therefore, further deposition of electrodes or wirings on the surface of the element does not cause the problem that the electrodes or wirings are torn because of their great level differences.

A Hall-effect magnetic head using a Hall element according to the present invention is stable and has good properties.

BRIEF DESCRIPTIONS OF THE DRAWINGS

DESCRIPTION OF THE PRESENTLY PREFERRED EMBODIMENTS

The present invention is illustrated by examples hereinafter.

Formation of thin films of various patterns of InSb having a size of 0.5 × 0.5 mm over the entire surface of a ferrite substrate polished as a mirror and having a dimension of 23 mm × 18 mm × 4 mm in thickness will be hereinafter explained in the order of the process steps by using the attached drawings.

Figure 1:
FIGS. 1, 2, 3 and 4 are cross-sections of the intermediate products of the magnetosensitive thin film semiconductor element in accordance with one example of the present invention.
Figure 2:
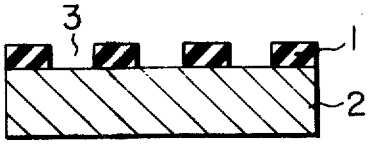
Figure 3:
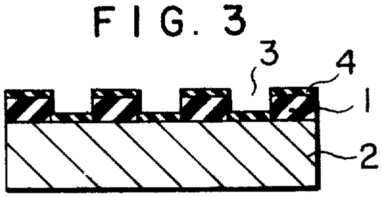
Figure 4:
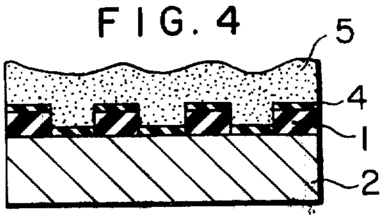
Figure 5:
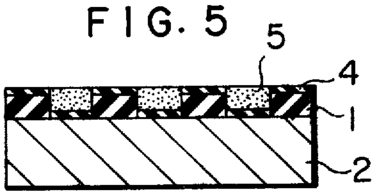
FIG. 5 is a cross-section of the magnetosensitive thin film semiconductor element in accordance with one example of the present invention.

FIGS. 1 to 5 show cross-sections of the substrate having a pattern. (1) An $SiO_2$ film 1 of about 2 μm in thickness is firstly deposited over the entire surface of said ferrite support 2 by sputtering (FIG. 1). (2) $SiO_2$ film 1 is photoetched to form channels 3 having a predetermined pattern and depth (FIG. 2). (3) A further $SiO_2$ film 4 of 0.6 μm in thickness is deposited by sputtering onto support 2 including channels 3 (FIG. 3). This film 4 does not only give sharp edges to the film 1 of FIG. 2, but also it prevents support 2 from contacting an InSb film 5 which is subsequently deposited. (4) The InSb film 5 of about 5 μm in thickness is deposited under vacuum over the entire surface of the substrate (FIG. 4). (5) InSb film 5 is removed by lapping to the level of the surface of the film 4 on the film 1 (FIG. 5).

Figure 6:
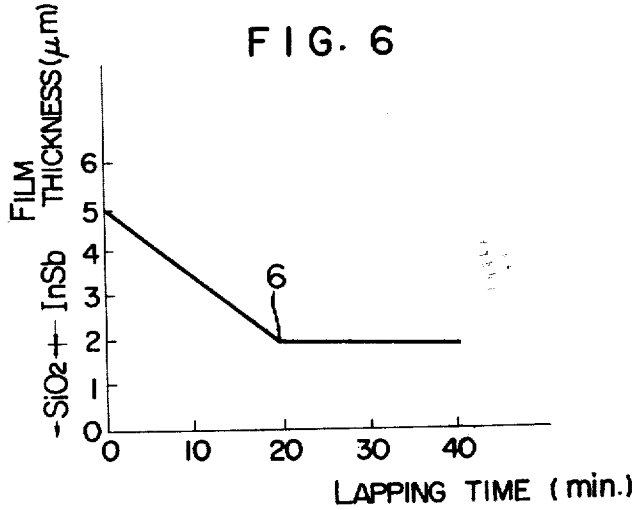
FIG. 6 is a graph showing a relationship between a polishing time and a thickness of a semiconductor thin film in the polishing step of the process in accordance with the present invention.

A lapping rate in lapping InSb film 5 varies as shown in FIG. 6. In FIG. 6, the abscissa represents lapping time and the ordinate the thickness of film. As is clear from FIG. 6 a lapping rate, after the surface of the $SiO_2$ film was exposed, i.e., beyond point 6, is below 1/30 lower than that of the InSb film and, therefore, it is clear that the lapping can be stopped with ease at a level of the surface of the $SiO_2$ film.

From the above, it is clear that the thickness of the InSb film can be controlled by controlling the depth of the channels. According to experiments, it is found that a dispersion in the thickness of the films on the substrate is below 5%, and a difference between the highest point and the lowest point on the surface of the resulting element is at most below 0.1 μ.

Furthermore, a pattern comprising 500 InSb films is formed over the entire surface of a substrate having a dimension of 30 mm × 30 mm × 2 mm in thickness in the same manner. According to the comparison of the InSb films with each other after lapping, it is found that a dispersion in the thickness of the films is ± 0.05 μm or less.

To the contrary, with prior art InSb thin film semiconductor elements having the structure in which thin films are projected on a substrate, a dispersion in the thickness of the thin films is ± 1 μm. As a result a dispersion in the electrical properties of the thin films reaches ± 30 %.

Figure 7A:
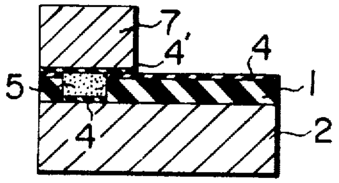
FIGS. 7A and 7B are a cross-section and a partial plan view of the thin film semiconductor element in accordance with one example of the present invention, the element having a pole piece applied thereon.
Figures 7B, 8:
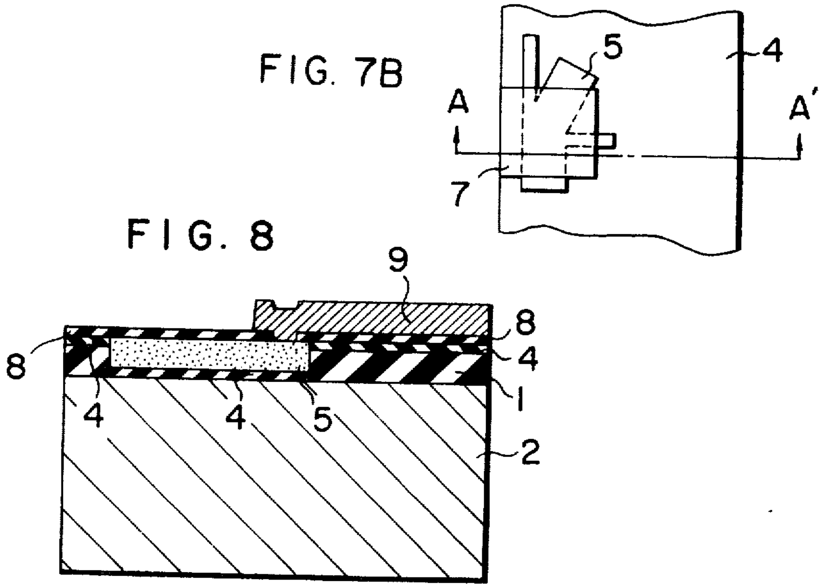
FIG. 8 is a cross-section of the thin film semiconductor element in accordance with one example of the present invention, the element having a thin film as an electrode deposited thereon.

Next, a pole piece of ferrite is attached onto the above-formed InSb films having a K-type pattern through a binder. FIG. 7A is a crosssection taken along line A–A' of FIG. 7B and FIG. 7B is a partial plan view of the product, respectively. Reference number 7 in FIGS. 7A and 7B shows the attached pole piece. An $SiO_2$ film 4' of about 0.6 μm in thickness is deposited by sputtering on the surface of the pole piece connecting with the InSb film in order to avoid the direct contact between the pole piece and the InSb film. As is clear from FIG. 7, no pressure is applied to the semiconductor thin film 5 because the pole piece 7 directly contacts the $SiO_2$ film 4 deposited on the substrate. Thus, problems such as mechanical deterioration of the semiconductor thin film 5 or increasing of noise by the piezo effect can be perfectly avoided.

To the contrary, in the case of a Hall element in which a pole piece is attached to an InSb thin film semiconductor element having the prior art structure in which the semiconductor thin film is projected on the substrate, the pressure under which the pole piece is attached to the element causes the piezo effect. A voltage from this piezo effect reaches ± 20 % of the Hall output from the InSb thin film. Further, in an extreme case the InSb thin film is broken.

When the thickness of a semiconductor thin film is smaller than the depth of channels, there are obtained almost the same advantages as those obtained above, that is, there is little dispersion in the thickness of film and there is no influence of the pressure under which a pole piece is attached to the element.

Finally, the InSb thin film semiconductor element produced by the above example is provided thereon with an Al-thin film wiring by vacuum evaporation. FIG. 8 is a cross-section of said element provided with said wiring. The InSb thin film 5 is protected by covering it with a $SiO_2$ thin film 8 of about 0.6 μm in thickness. Subsequently, a hole for an electrode is formed through the thin film 8 to the semiconductor thin film 5. An aluminum film having a thickness of about 2 μm is deposited over the entire surface of the thin film 8 and holes by vacuum evaporation and then photoetched in the known manner to form a desired pattern of wiring. Reference number 9 shows the thus-photoetched thin film of aluminum. As is shown in FIG. 8, the difference between the surface levels of the thin film 9 is only below about 0.6 μm caused from the depth of the hole through the protective thin film 8, i.e., the thickness of the protective thin film 8. This difference does not cause such a problem that the thin film is torn. In this example, satisfactory wirings are obtained in a yield of about 99.99% or more. The thickness of a thin film for wirings may be below 2 μm because in the thin film semiconductor element of the present invention there is no problem that the wiring thin film will be torn.

Figure 9:
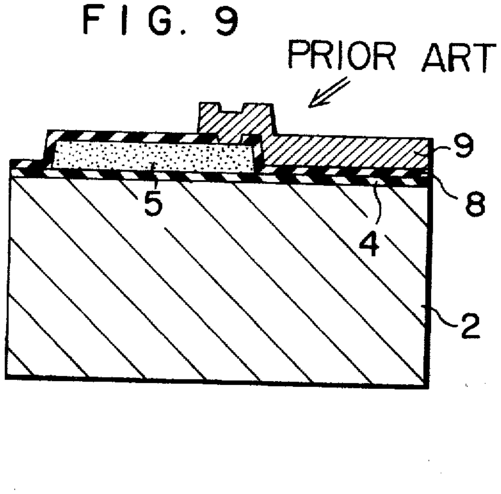
FIG. 9 is a cross-section of a prior art thin film semiconductor element having an electrode in the form of thin film deposited thereon.

To the contrary, when an aluminum thin film for wirings is deposited onto an InSb thin film semiconductor element having the prior art structure in which a semiconductor thin film is projected on a substrate, it is clear from the cross-section shown in FIG. 9 that the difference between surface levels of the aluminum thin film 9 is not only a small one caused by the thickness of the protective thin film 8, but also a larger one caused by the InSb thin film 5, which is indicated by the "arrow" in FIG. 9. This larger difference is approximately equal to the thickness of the InSb thin film 5, e.g., about 2 μm. Therefore, satisfactory wirings are obtained with a yield of only about 80% or less.

In the above examples only the vacuum evaporation is employed as a means for applying a semiconductor thin film, but other means may be employed in the present invention. For example, the formation of the InSb thin film may be achieved by dipping in a molten alloy consisting of 1 to 69 percent by weight of Sb and the balance In a substrate at a temperature slightly lower than the melting point of said alloy.

As mentioned above, the magnetosensitive thin film semiconductor element according to the present invention has no projections on the surface of a substrate and, therefore, application of an article such as a pole piece to a thin film does not give a detrimental pressure to the element. Further, when the element is constituted so that the difference between the surface levels of the thin film and the substrate is as small as possible, the frequency of such problems that a thin film for wirings is torn is conspicuously reduced. When the magnetosensitive thin film semiconductor element of the present invention is manufactured in accordance with the process of the present invention, the uniform thickness of a semiconductor thin film can be easily obtained and a lower dispersion in properties can be achieved. Another advantage of the present invention is that in the element a pattern of a semiconductor thin film is surrounded by walls of a substrate and this imparts strength to the element.

What is claimed is:

1. A magnetosensitive thin film semiconductor element, comprising a semiconductor thin film having a predetermined flat shape and thickness, the bottom and side surfaces of which are surrounded by an insulator film and adhere to said insulator film which constitutes a substrate consisting of a material exhibiting a high magnetic permeability and covered by said insulator film which is harder than the material used for said semiconductor thin film and the upper surface of said semiconductor thin film being approximately on a level with the surface of said substrate.

2. The magnetosensitive thin film semiconductor element according to claim 1, wherein said semiconductor thin film is polycrystalline.

3. The magnetosensitive thin film semiconductor element according to claim 1, wherein said semiconductor thin film consists of a compound.

4. The magnetosensitive thin film semiconductor element according to claim 1, wherein said semiconductor thin film consists of InSb.

5. The magnetosensitive thin film semiconductor element according to claim 1, wherein said material exhibiting a high magnetic permeability is a ferrite.

6. The magnetosensitive thin film semiconductor element according to claim 1, wherein said semiconductor thin film consists of InSb and said material exhibiting a high magnetic permeability is a ferrite.

7. The magnetosensitive thin film semiconductor element according to claim 1, wherein said insulator film consists of $SiO_2$.

8. A magnetosensitive thin film semiconductor element, comprising:

a substrate of a material having high magnetic permeability;

a first layer of insulating material disposed on a surface of said substrate, a first portion of said first layer of insulating material being relatively thin and a second portion of said first layer of insulating material, surrounding said first portion, being relatively thick; and a layer of semiconductor material disposed entirely on said first portion of said layer of insulating material and contiguous to the side portion of said second portion of said layer of insulating material, the thickness of said layer of semiconductor material being such that the upper surface thereof is approximately on a level with the surface of said second portion of said first layer of insulating material.

9. The magnetosensitive thin film semiconductor element according to claim 8, further including a second layer of insulating material disposed in the upper surfaces of each of said first layer of insulating material and said layer of semiconductor material and having an opening therein exposing a portion of the upper surface of said layer of semiconductor material, and a thin metallic film disposed on said second layer of insulating material and extending through said opening into contact with said portion of the upper surface of said layer of semiconductor material.

10. A magnetosensitive thin film semiconductor element, comprising:

a substrate of a material having high magnetic permeability;

a first layer of insulating material disposed on a surface of said substrate, a first portion of said first layer of insulating material being relatively thin and a second portion of said first layer of insulating material, surrounding said first portion, being relatively thick; and a layer of semiconductor material disposed entirely on said first portion of said layer of insulating material and contiguous to the side portion of said second portion of said layer of insulating material, the thickness of said layer of semiconductor material being such that the upper surface thereof is at most approximately on a level with the surface of said second portion of said first layer of insulating material.

* * * * *